United States Patent
Greig et al.

(10) Patent No.: US 6,215,896 B1
(45) Date of Patent: *Apr. 10, 2001

(54) SYSTEM FOR ENABLING THE REAL-TIME DETECTION OF FOCUS-RELATED DEFECTS

(75) Inventors: R. Michael Greig; Robert Stone, both of Austin; Mark K. Shackelford, Round Rock, all of TX (US)

(73) Assignee: Advanced Micro Devices, Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/974,800

(22) Filed: Nov. 20, 1997

Related U.S. Application Data

(63) Continuation of application No. 08/537,240, filed on Sep. 29, 1995, now abandoned.

(51) Int. Cl.[7] .................................................... G06K 9/00
(52) U.S. Cl. ................................................................ 382/149
(58) Field of Search ................................... 382/145, 149, 382/151, 228, 144, 255, 154; 364/490, 491; 348/87, 126; 438/14–18; 356/237.4, 237.5, 375; 702/166, 179; 250/559.29, 559.38, 559.39, 559.41

(56) References Cited

U.S. PATENT DOCUMENTS

| | | | | |
|---|---|---|---|---|
| 4,849,901 | * | 7/1989 | Shimizu | 364/468.28 |
| 4,870,668 | * | 9/1989 | Frankel et al. | 378/34 |
| 4,878,114 | * | 10/1989 | Huynh et al. | 382/108 |
| 5,191,200 | * | 3/1993 | Van Der Werf et al. | 250/201.4 |
| 5,243,377 | * | 9/1993 | Umatate et al. | 355/53 |
| 5,260,154 | * | 11/1993 | Forrest | 430/30 |
| 5,362,585 | * | 11/1994 | Adams | 430/30 |
| 5,365,051 | * | 11/1994 | Suzuki et al. | 250/201.2 |
| 5,440,649 | * | 8/1995 | Kiyasu et al. | 382/147 |
| 5,544,256 | * | 8/1996 | Brecher et al. | 382/149 |
| 5,546,179 | * | 8/1996 | Cheng | 536/73 |
| 5,787,190 | * | 7/1998 | Peng et al. | 382/145 |
| 5,884,242 | * | 3/1999 | Meier et al. | 702/179 |

OTHER PUBLICATIONS

R. Goodall, J. Kawski; Effects and Interactions of Wafer Shape and Stepper Chucks on Wafer Flatness Control; 1993; IEEE ASMC; p.p. 118–123.*

* cited by examiner

Primary Examiner—Leo H. Boudreau
Assistant Examiner—Brian P. Werner

(57) ABSTRACT

A real-time hotspot detection system is disclosed. In a preferred embodiment, the real-time hotspot detection system of the present invention comprises a photolithography stepper that has been modified to output z-height focus data for each cell to a fault detection module of the present invention. After the entire wafer has been exposed by the stepper, the fault detection module computes the mean and standard deviation and/or other statistical data for the wafer data and compares the computed standard deviation with a predetermined limits for "normal" standard deviation, representative of a completely flat wafer having no hotspots thereon. If the computed standard deviation is outside the limits for the normal standard deviation, the fault detection module provides control signals to the stepper for halting the operation thereof and for generating an indication to the stepper operator, via a pole light associated with the stepper, that a failure has occurred. In addition, a wafer map showing the z-height data of the wafer that caused the failure may be displayed on a display associated with the module to enable a visual inspection to be performed and the cause of the hotspot to be more easily located.

27 Claims, 4 Drawing Sheets

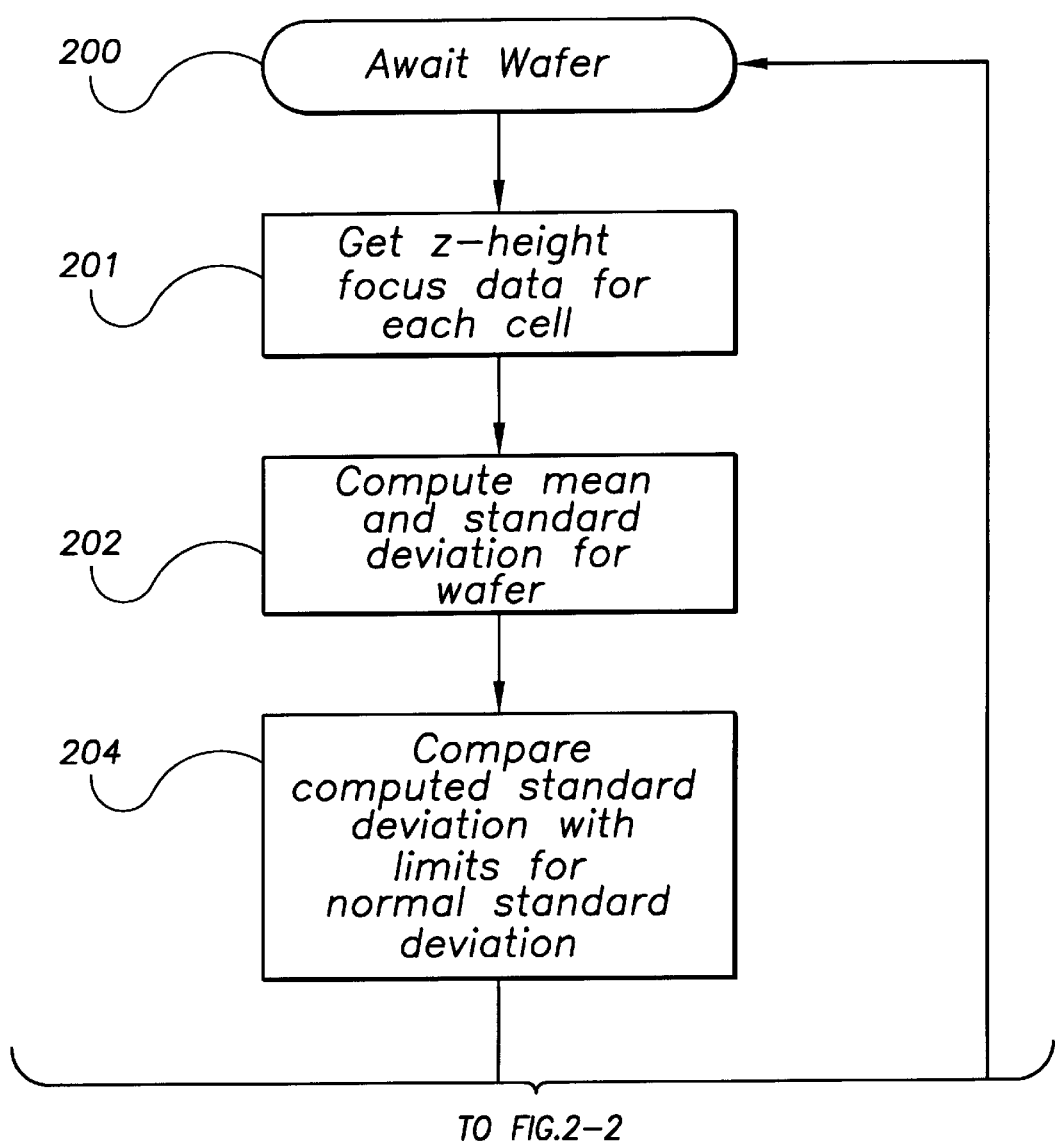

FIG.3

HOTSPOT MONITOR WAFER MAP 300

```
              FLAT
      3 3 4 3 3 3 3 3 3 4
    3 4 4 3 3 4 4 3 3 4 4 4 4
  3 3 4 3 4 4 4 4 4 4 4 4 4 4 5
  4 4 4 4 4 4 4 4 4 4 4 4 4 5 5
  4 4 4 4 4 4 4 4 4 4 4 4 5 5 6 6
    5 5 5 5 4 5 4 4 5 5 6 6
      5 5 6 6 7 7 7
```

WAFER INFORMATION 302
STEPPER: 2
DEVICE: 29200C
LAYER: R70
WAFER: 45
DATE: 02/23/95 12:10

WAFER STATISTICS 304
OF CELLS: 91
MEAN: 2.124
STD: 0.717
MAX STSD: 0.723
STSD STD: 0.278

GRAPHING INTERVAL = 0.60
3.924 <=7
3.324 <=6 < 3.924
2.724 <=5 < 3.324
1.524 <=4 < 2.724
0.924 <=3 < 1.524
0.324 <=2 < 0.924
0.324 >1

SYSTEM FOR ENABLING THE REAL-TIME DETECTION OF FOCUS-RELATED DEFECTS

This is a Continuation of application Ser. No. 08/537,240, filed Sep. 29, 1995, now abandoned.

TECHNICAL FIELD

The invention relates generally to the monitoring of the performance of photolithography steppers used in transferring integrated circuit device patterns onto wafers and, more particularly, to a system for enabling the real-time detection of focus-related defects created by particle-induced deformation of wafers in such steppers or mechanical or electronic malfunctioning of such steppers.

BACKGROUND OF THE INVENTION

Photolithography, defined as a process for effecting the photographic transfer of a pattern to a surface for etching or implanting, is employed in the fabrication of myriad types of semiconductor devices, including integrated circuit (IC) devices. In general, photolithography involves the performance of a sequence of process steps, including coating a semiconductor wafer with a resist layer, exposing the coated wafer to a patterned light source, developing the resist layer, processing the semiconductor wafer through the developed resist layer, and removing the resist layer. An optical photolithography stepper apparatus, or "stepper," such as those available from ASM Lithography, Inc., located in Eindhoven, Netherlands, is typically used to expose the resist layer. An image of each layer of an IC die is formed on a small, rectangular piece of glass referred to as a reticle, or "mask." The mask is placed on the stepper and a reduced image thereof is projected onto a portion of the resist layer covering the semiconductor wafer.

Where numerous ICs are to be fabricated from a single wafer, a mask used in the fabrication of any one IC is also used in the fabrication of the other ICs from the wafer. This is accomplished by using a stepper to index, or "step," the wafer under an optical system including the mask and a projection lens, in the x or y direction by a predetermined pitch. At each step, the photoresist is exposed by the optical system, typically with ultraviolet light, to form an image of the mask in the layer of photoresist. Once the entire wafer has been stepped, the wafer is then removed from the stepper and the image developed. At that point, the wafer is etched to remove portions of the underlying film or implant to prepare the wafer for the next stage of material deposition or other types of etching processes. At a later stage in the fabrication process, the wafer is returned to the stepper for exposure of the wafer dice to another mask.

In operation, at each step, or "cell," the stepper performs a focusing operation, typically by moving the wafer in the z-direction to match the wafer surface with the optimum image plane of the optical system. To perform the focusing operation, certain focus data, specifically, the position of the wafer surface in the z-direction, is measured and the position of the wafer in the z-direction is servo-controlled to nullify the detected focus shift amount. This method has proven to be fairly accurate assuming that the moveable stage, or chuck, on which the wafer rests and the wafer itself are completely flat; however, this is not always the case. In particular, although significant measures are taken to ensure that the fabrication environment is completely free of particles, it would not be impossible for one or more small particles to become trapped between the chuck and the wafer, such that when the wafer is sucked down onto the chuck, the wafer will deform to the particle locally. As a result, the point at which the wafer is deformed will be out of focus, i.e., over-or under-exposed. This effect is typically referred to as a "hotspot," a "chuck spot" or a "chuck ring." Such hotspots later result in dice with substandard geometries, i.e., geometries that are too large, too small, or not resolved. A single hotspot may affect more than one die, all of which must be scrapped or the entire wafer reworked to correct the error.

In many cases, the particle that caused the defect is stuck to the chuck itself, such that more than one wafer will be affected. In view of the fact that the problem may not be detected until visual inspection of the wafers, often several hours later, it is not unlikely that hundreds of wafers could be detrimentally affected before the problem is corrected, thereby significantly multiplying the damage. As previously indicated, the affected wafers must be reworked, resulting in both a productivity and a yield hit, or the affected dice must be scrapped. Moreover, many fabrication facilities are running at full capacity, meaning that every IC chip produced can be sold, and the only way to increase production is to decrease the number of dice that are wasted.

At the present time, the primary method of detecting hotspots is by conducting a post-photolithographic visual inspection of each wafer using a high-power microscope; however, as previously mentioned, if the particle that caused the hotspot is stuck to the chuck, by the time the wafers are inspected, several wafers may already have been affected. One solution to this problem would be to visually inspect each wafer immediately after it comes off the stepper and completes the photoresist development process step. Clearly, this "solution" would result in an unacceptable increase in the time and expense required to produce each wafer, and hence, each die. Moreover, a minor error in focus caused by a hotspot may not be detected by a visual inspection, but could still affect the performance of the resulting IC chips affected thereby.

Therefore, what is needed is a system for enabling the real-time detection of hotspots, which would allow steps to be taken immediately to correct the problem.

SUMMARY OF THE INVENTION

The present invention, accordingly, provides a method and a system for enabling the real-time detection of focus-related defects created by particle-induced deformation of a wafer and indicating detection of same to a stepper operator to enable corrective action to be taken immediately, thereby overcoming the problems associated with previous hotspot detection methods.

In a departure from the art, a real-time hotspot detection system of the present invention comprises a photolithography stepper that has been modified to output z-height focus data for each cell of a wafer to a fault detection module of the present invention. As used herein, "z-height" is the measurement of the distance of the wafer from the projection lens of the stepper. After the entire wafer has been exposed, the fault detection module computes the mean and standard deviation for the wafer data and compares the computed standard deviation with predetermined "normal" limits for standard deviation, for example, the mean±3σ, representative of a completely flat wafer having no hotspots or other focus abnormalities thereon. If the computed standard deviation falls outside the predetermined normal limits, the module provides control signals to the stepper for halting the operation thereof and providing an indication to the stepper operator, via a pole light, for example, that a failure has occurred. In addition, a wafer map showing the z-height data of the wafer that caused the failure may be displayed on a display associated with the module to enable a visual inspection to be performed and the cause of the problem (i.e., a particle or chuck tilt) to be more easily determined.

In another aspect of the invention, the z-height focus data for a single wafer is uploaded by a communications PC running an appropriate program to a network drive, where it is stored in a file that may be accessed and analyzed off line by users connected to the network.

A technical advantage achieved with the invention is that it enables hotspots to be detected and corrective action to be taken almost immediately after the first wafer to experience the problem is exposed. Accordingly, the number of wafers, and therefore, dice, affected by the problem can be significantly decreased.

A further technical advantage achieved with the invention is that it enables the detection of hotspots that may not be detected by a visual inspection, but that could cause performance problems in the finished IC product.

A further technical advantage achieved with the invention is that it halts operation of the stepper and provides a visual indication of same to the stepper operator immediately upon detecting a hotspot problem on a wafer.

Yet another technical advantage achieved with the invention is that it reduces the number of test wafers needed to qualify a stepper for production use.

BRIEF DESCRIPTION OF THE DRAWINGS

FIG. 3 illustrates a wafer map displayed on a display of the system of FIG. 1.

DETAILED DESCRIPTION OF THE PREFERRED EMBODIMENT

Figure 1:
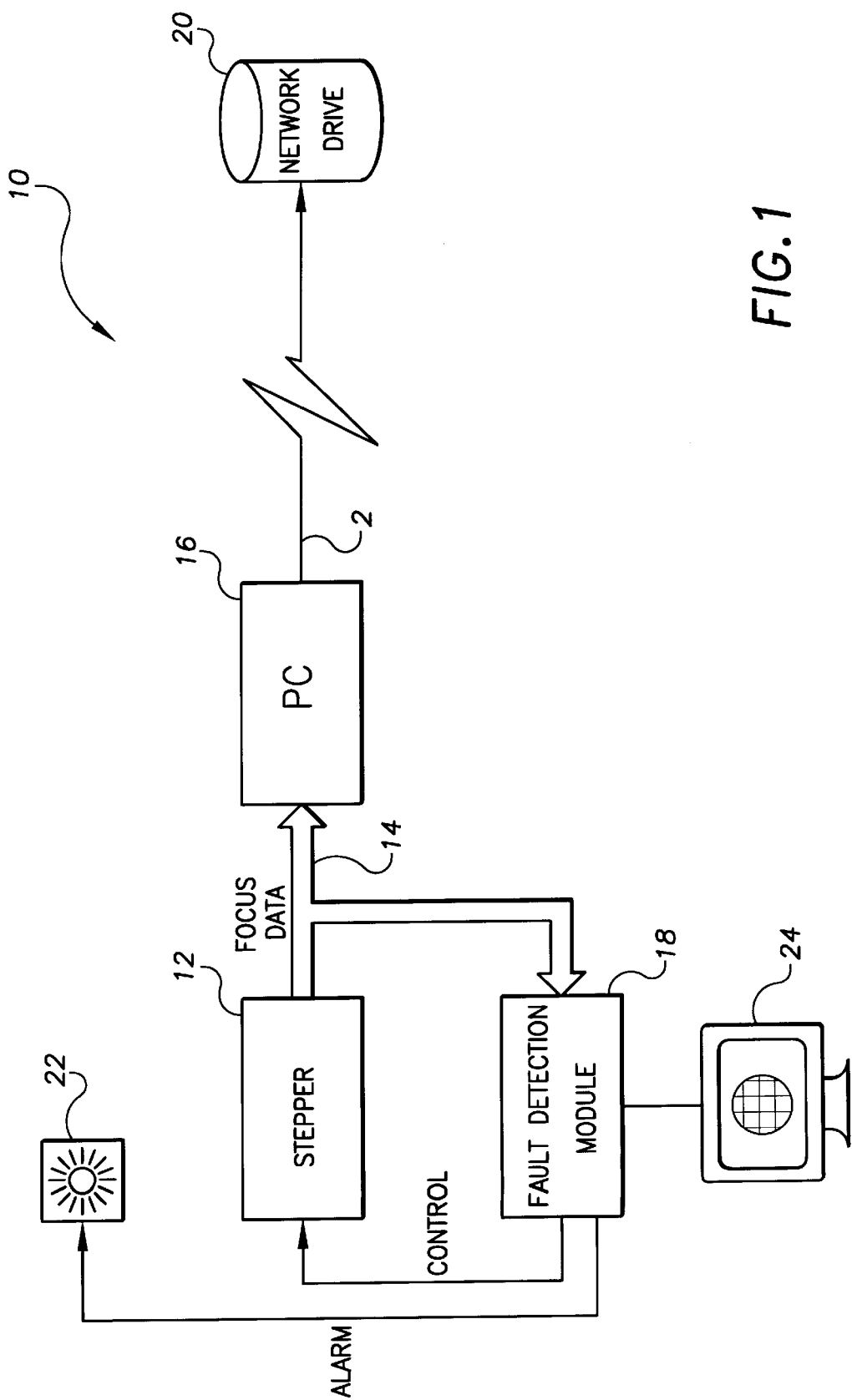
FIG. 1 is a schematic block diagram of the real-time fault detection system of the present invention.

FIG. 1 is a schematic block diagram of a real-time fault detection system 10 embodying features of the present invention for use in a semiconductor fabrication facility ("fab"). The system 10 comprises at least one photolithography stepper 12, which may be, for example, an ASML stepper available from ASM Lithography, Inc., Eindhoven, Netherlands, for projecting a series of patterns onto a wafer loaded therein in a known fashion. In accordance with the features of the present invention, the stepper 12 is modified such that x, y and z focus data used by the stepper to position the wafer at each cell is exported out of the stepper 12 on a line 14 to a communication PC, or other appropriate computer system, 16 and to a fault detection module 18. In one aspect of the invention, all of the focus data for a single wafer is stored in a file, which is periodically uploaded by a program running on the PC 16 to a network drive 20, via a network 2, from which it may be accessed using computers (not shown) connected to the network 2 and analyzed offline in any number of different fashions.

As will be described in greater detail with reference to FIG. 2, the fault detection module 18 comprises hardware and software for accumulating the focus data for each cell and, once an entire wafer has been exposed, calculating a mean and standard deviation of the accumulated z-height focus data, as well as other desired statistical data. The module 18 compares the standard deviation of the wafer thus computed with predetermined normal limits for standard deviation that have been empirically determined to indicate that there is at least one hotspot on the wafer. When the standard deviation of the z-height data for the wafer falls outside the predetermined limits for normal standard deviation, the module 18 generates control signals to the stepper 12 for halting operation of the stepper 12 and generating a signal to a stepper operator that the stepper has been halted. In a preferred embodiment, a pole light 22, or some other type of illuminable and/or audible indicator, is provided on or near the stepper 12 for this purpose. In addition, a wafer map (FIG. 3) of the wafer that caused the stepper 12 to fail, showing the Z-height focus data for each cell of the wafer, is displayed on a display 24 associated with the module 18.

Figure 2:
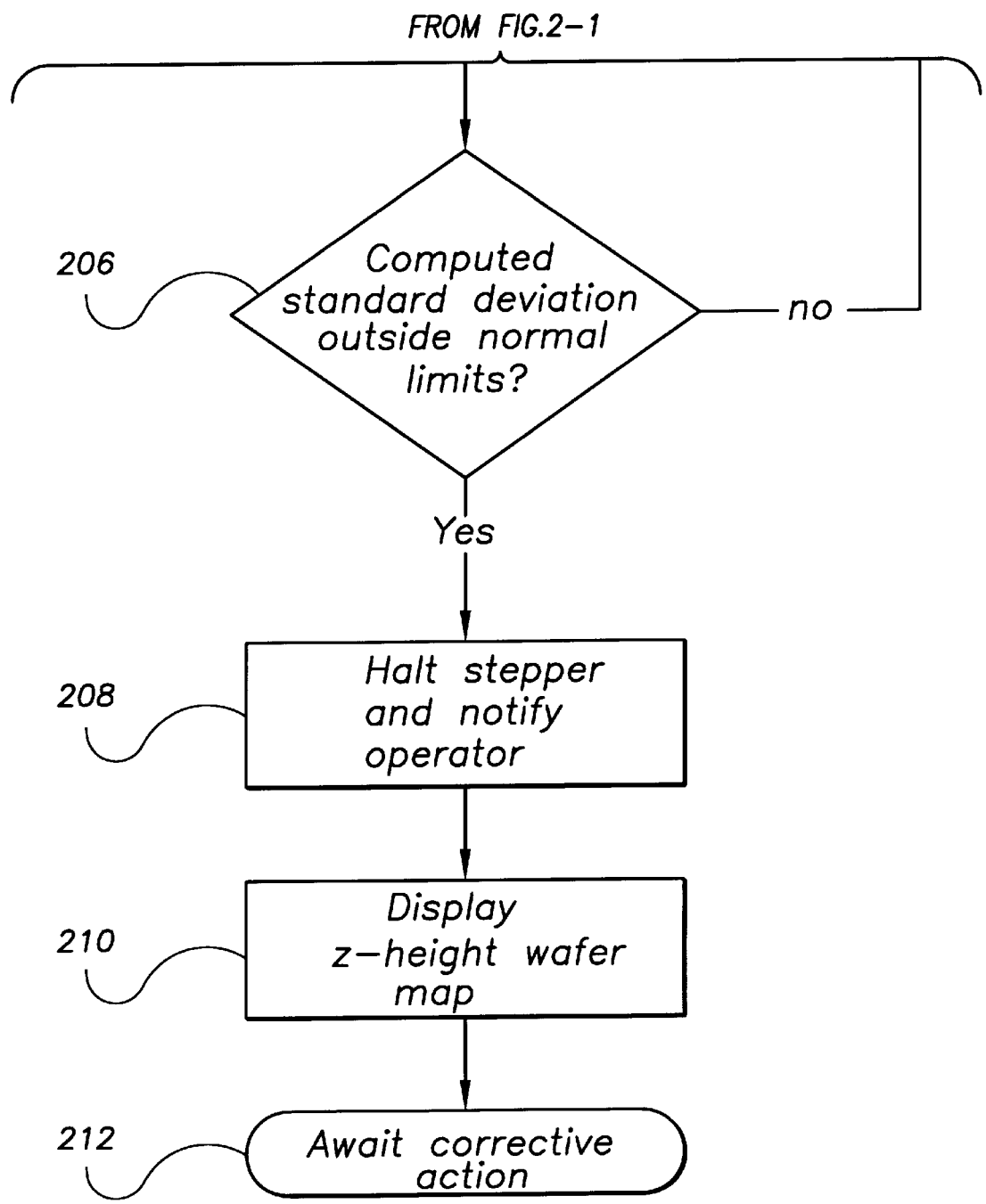
FIG. 2 is a flowchart of the operation of the system of FIG. 1.

Referring now to FIG. 2, operation of the system 10 will be described in greater detail. Once a wafer has been loaded into the stepper 12 in step 200, in step 201, z-height focus data for each cell is output from the stepper 12 and accumulated by the module 18. In step 202, once the entire wafer has been exposed, a mean and standard deviation for the wafer is calculated. In step 204, the computed standard deviation is compared with the predetermined limits for normal standard deviation, e.g., the mean±3σ, to determine whether there are any hotspots or other focus abnormalities on the wafer. In step 206, a determination is made whether the computed standard deviation falls outside the limits for the normal standard deviation. If not, the accumulated focus data for the wafer is discarded or stored in a file and execution returns to step 200. If in step 206 it is determined that the computed standard deviation for the wafer falls outside the limits for the normal standard deviation, execution proceeds to step 208, in which control signals are generated to the stepper 12 to halt the operation of the stepper 12 and illuminate the light 22. In step 210, a wafer map for the wafer that caused the stepper 12 to fail is displayed on the display 24. Execution then proceeds to step 212 to await corrective action on the stepper 12.

FIG. 3 illustrates a z-height wafer layout map 300 such as might be displayed on the display 24. In the preferred embodiment, as shown in FIG. 3, information for identifying the stepper, device, layer and wafer to which the map corresponds, as well as the time and date, are displayed with the wafer in a "WAFER INFORMATION" section 302. In addition, a "WAFER STATISTICS" section 304 indicates the number of cells on the wafer and the computed mean and standard deviation ("STD") for the wafer.

Referring to the map 300, each cell of the wafer is designated by a numeral, in this case, 1 through 7, indicating a range into which the z-height focus data for the cell falls. In the illustrated embodiment, a "7" indicates a cell with a z-height greater than 3.924 microns, a "6" indicates a cell with a z-height between 3.324 and 3.924 microns, and so on. Accordingly, an operator could preliminarily determine the cause of the hotspot by viewing the wafer map displayed on the display 24. For example, referring to the wafer map 300, because the numbers go from 3s and 4s in the upper left portion of the wafer to 6s and 7s in the lower right portion of the wafer, it would be logical to assume that the bottom right portion of the wafer was raised out of the focal plane. It should be recognized that wafer maps could be generated and displayed showing any number of different types of data, other than z-height, which may be indicative of hotspots.

It is understood that the present invention can take many forms and embodiments. The embodiments shown herein are intended to illustrate rather than to limit the invention, it being appreciated that variations may be made without departing from the spirit of the scope of the invention. For example, the module 18 may be implemented using a neural network for analyzing the z-height focus data for each and determining whether there is a hotspot on the wafer, in which case, straight statistics, such as standard deviation, would not be necessary. In addition, other types of analysis could be performed on the data by the fault detection module 18 for use in controlling the operation of the stepper 12. In addition, the wafer map 300 could be designed to display information other than z-height focus data, such as step-to-step delta values or the like.

Although illustrative embodiments of the invention have been shown and described, a wide range of modification, change and substitution is intended in the foregoing disclosure and in some instances some features of the present invention may be employed without a corresponding use of the other features. Accordingly, it is appropriate that the appended claims be construed broadly and in a manner consistent with the scope of the invention.

What is claimed is:

1. A system for enabling the real-time detection of a focus-related defect induced in a semiconductor wafer during a photolithographic process, said wafer including a plurality of cells, the system comprising:
   a photolithography stepper for transferring an image to each cell of said wafer, said photolithography stepper outputting focus data, including z-height data, for each cell;
   a fault detection module electrically connected to said photolithography stepper for receiving the focus data output for each cell and, in response to said focus data for all the cells of said wafer, for calculating a mean and standard deviation directly from the focus data for all of the cells on the wafer and comparing the calculated standard deviation to the mean ±3σ, representative of a completely flat wafer having no hotspots or other focus abnormalities thereon; and
   wherein in response to a determination that the calculated standard deviation does not fall within said mean ±3σ, said fault detection module halts operations of said photolithography stepper.

2. The system of claim 1 further comprising a video monitor electrically connected to said fault detection module for displaying a wafer map of said wafer responsive to a determination that there is a focus-related defect on said wafer.

3. The system of claim 1 further comprising a communications computer electrically connected to said photolithography stepper for receiving said focus data therefrom, said communications computer being further electrically connected to a network drive via a network, said communications computer periodically uploading files containing said focus data to said network drive for storage thereon and access therefrom via other computers connected to said network.

4. The system of claim 1 further comprising an alarm electrically connected to said fault detection module for providing an indication to an operator of said photolithography stepper when said photolithography stepper operation has been halted.

5. The system of claim 4 wherein said alarm comprises an audible indicator.

6. The system of claim 4 wherein said alarm comprises a visible indicator.

7. The system of claim 1 wherein said fault detection module comprises a neural network.

8. The apparatus of claim 1 wherein said means for receiving and determining comprises a neural network for analyzing said focus data for said wafer.

9. Apparatus for enabling the real-time detection of a focus-related defect induced in a semiconductor wafer during a photolithographic process, the apparatus comprising:
   means for transferring an image to each of a plurality of cells of said wafer, said transferring means outputting focus data, including z-height data, for each of said cells of said wafer;
   means electrically connected to said transferring means for receiving said focus data;
   means for determining the mean and standard deviation directly from said focus data from all said cells of said wafer; and
   means for determining whether said standard deviation falls within the mean ±3σ, representative of a completely flat wafer having no hotspots or other focus abnormalities thereon;
   wherein responsive to a determination that said standard deviation does not fall within said mean ±3σ, operation of said transferring means is halted.

10. The apparatus of claim 9 wherein said transferring means comprises a photolithography stepper.

11. The apparatus of claim 9 further comprising display means electrically connected to said means for receiving and determining for displaying a wafer map of said wafer responsive to a determination that said focus data for said wafer does not fall within said predetermined normal limits.

12. The apparatus of claim 9 further comprising communication means electrically connected to said transferring means for receiving said focus data therefrom, said communication means being further electrically connected to a storage means via a network, said communications means periodically uploading files containing said focus data to said storage means for storage thereon and access therefrom via computers connected to said network.

13. The apparatus of claim 12 wherein said communication means comprises a communications computer connected to said network.

14. The apparatus of claim 9 further comprising an indicator means electrically connected to said means for receiving and determining for providing an indication to an operator of said transferring means when said transferring means operation has been halted.

15. The apparatus of claim 14 wherein said indicator means comprises an audible indicator.

16. The apparatus of claim 14 wherein said indicator means comprises a visible indicator.

17. A method of enabling the real-time detection of focus-related defects induced in a wafer during performance of a photolithographic process performed using a photolithography stepper, the method comprising:
   transferring an image to each of a plurality of cells of said wafer, said photolithography stepper outputting focus data, including z-height data, for each of said cells of said wafer;
   collecting said focus data for each of said cells of said wafer;
   in response to said focus data for each of said cells of said wafer, determining a mean and standard deviation directly from said focus data for all of said cells;
   determining whether said standard deviation for said wafer falls within the mean ±3σ, representative of a completely flat wafer having no hotspots or other focus abnormalities thereon; and responsive to a determination that said focus data for said wafer does not fall within said mean ±3σ, halting operation of said photolithography stepper.

18. The method of claim 17 further comprising:
comparing said calculated standard deviation to said mean±3σ.

19. The method of claim 17 further comprising displaying a wafer map of all of said cells of said wafer responsive to a determination that said focus data for said wafer does not fall within said predetermined normal limits.

20. The method of claim 17 further comprising periodically uploading files containing said focus data to a network drive for storage thereon and access therefrom via a network.

21. The method of claim 17 further comprising providing an indication to an operator of said photolithography stepper when said photolithography stepper operation has been halted.

22. The method of claim 21 wherein said indication comprises an audible indication.

23. The method of claim 21 wherein said indication comprises a visible indication.

24. A semiconductor fabrication process, comprising:
   (a) stepping a semiconductor wafer to align one cell of a plurality of cells of the wafer with a photolithography system, each of the plurality of cells corresponding to one or more integrated circuit chips;
   (b) transferring an image to one cell of the wafer;
   (c) determining focus data for the cell;
   (d) repeating (a)–(c) for each cell of the plurality of cells on the wafer;
   (e) determining a defect value, including a mean and standard deviation, directly from the focus data, including z-height data, for all of the cells on the wafer;
   (f) in response to said focus data of step (e), determining whether the defect value falls within the mean ±3σ, representative of a completely flat wafer having no hotspots or other focus abnormalities thereon; and
   (g) continuing fabrication of the wafer if the defect falls within said mean ±3σ.

25. A semiconductor wafer formed according to the process of claim 24.

26. An integrated circuit chip formed according to the process of claim 24.

27. A system for enabling the real-time detection of a focus-related defect induced in a semiconductor wafer during a photolithographic process, said wafer including a plurality of cells, the system comprising:
   a photolithography stepper for transferring an image to each cell of said wafer, the photolithography stepper generating focus data, including z-height data, for each cell;
   using the focus data for all the cells, a fault detection module electrically connected to said photolithography stepper for receiving the focus data, the fault detection module configured and arranged to use the focus data for the cells of the wafer by calculating a mean and standard deviation directly from the focus data for all of the cells on the wafer and comparing the calculated standard deviation to the mean ±3σ, representative of a reference wafer having a set of known characteristics; and
   wherein in response to a determination that the calculated standard deviation does not fall within the mean ±3σ, the fault detection module interrupts operations of said photolithography stepper.

* * * * *